(12) United States Patent
Hasche et al.

(10) Patent No.: US 9,040,405 B2
(45) Date of Patent: May 26, 2015

(54) GATE ELECTRODE WITH A SHRINK SPACER

(71) Applicant: GLOBALFOUNDRIES Inc., Grand Cayman (KY)

(72) Inventors: Tom Hasche, Dresden (DE); Sven Beyer, Dresden (DE); Gerhard Lembach, Langebrueck (DE); Alexander Ebermann, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/043,181

(22) Filed: Oct. 1, 2013

(65) Prior Publication Data

US 2015/0091068 A1 Apr. 2, 2015

(51) Int. Cl.
*H01L 21/3205* (2006.01)
*H01L 29/40* (2006.01)
*H01L 29/423* (2006.01)

(52) U.S. Cl.
CPC .......... *H01L 29/401* (2013.01); *H01L 29/4232* (2013.01); *Y10S 438/942* (2013.01); *Y10S 438/947* (2013.01)

(58) Field of Classification Search
USPC .................. 438/478, 595, 288, 592, 942, 947
See application file for complete search history.

(56) References Cited

U.S. PATENT DOCUMENTS

| | | | |
|---|---|---|---|
| 2008/0286698 A1* | 11/2008 | Zhuang et al. | 430/323 |
| 2012/0049286 A1 | 3/2012 | Beyer et al. | |

* cited by examiner

*Primary Examiner* — Timor Karimy
(74) *Attorney, Agent, or Firm* — Amerson Law Firm, PLLC (57) ABSTRACT

A method of forming a semiconductor device including forming a dielectric material layer on a semiconductor layer, forming a gate electrode material layer on the dielectric material layer, forming mask features on the gate electrode material layer, forming a spacer layer on and at sidewalls of the mask features and on the gate electrode material layer between the mask features, removing the spacer layer from the gate electrode material layer between the mask features, and etching the gate electrode material layer and dielectric material layer using the hard mask features as an etch mask to obtain gate electrode structures. A semiconductor device including first and second gate electrode structures, each covered by a cap layer that comprises a mask material surrounded at the sidewalls thereof by a spacer material different from the mask material, and the distance between the first and second electrode structures is at most 100 nm.

16 Claims, 6 Drawing Sheets

GATE ELECTRODE WITH A SHRINK SPACER

BACKGROUND OF THE INVENTION

1. Field of the Invention

Generally, the subject matter disclosed herein relates to integrated circuits, and, more particularly, to gate electrode structures of transistor devices formed by double exposure and double etch techniques.

2. Description of the Related Art

The fabrication of microstructures, such as integrated circuits, requires tiny regions of precisely controlled size to be formed in one or more material layers of an appropriate substrate, such as a silicon substrate, an SOI (silicon-on-insulator) substrate or other suitable carrier materials. These tiny regions of precisely controlled size are typically defined by patterning the material layer(s) by applying lithography, etch, implantation and deposition processes and the like, wherein, typically, at least in a certain stage of the patterning process, a mask layer may be formed over the material layer (s) to be treated to define these tiny regions. Generally, a mask layer may consist of or may be formed by means of a layer of resist that is patterned by a lithographic process, typically a photolithography process. During the photolithographic process, the resist may be spin-coated onto the substrate surface and then selectively exposed to ultraviolet radiation through a corresponding lithography mask, such as a reticle, thereby imaging the reticle pattern into the resist layer to form a latent image therein. After developing the photoresist, depending on the type of resist, positive resist or negative resist, the exposed portions or the non-exposed portions are removed to form the required pattern in the layer of photoresist. Based on this resist pattern, actual device patterns may be formed by further manufacturing processes, such as etching, implantation and the like. Since the dimensions of the patterns in sophisticated integrated microstructure devices are steadily decreasing, the equipment used for patterning device features have to meet very stringent requirements with regard to resolution and overlay accuracy of the involved fabrication processes. In this respect, resolution is considered as a measure for specifying the consistent ability to print minimum size images under conditions of predefined manufacturing variations. One important factor in improving the resolution is the lithographic process, in which patterns contained in the photo mask or reticle are optically transferred to the substrate via an optical imaging system. Therefore, great efforts are made to steadily improve optical properties of the lithographic system, such as numerical aperture, depth of focus and wavelength of the light source used.

The resolution of the optical patterning process may, therefore, significantly depend on the imaging capability of the equipment used, the photoresist materials for the specified exposure wavelength and the target critical dimensions of the device features to be formed in the device level under consideration. For example, gate electrodes of field effect transistors, which represent an important component of modern logic devices, may have a length of less than 50 nanometers (nm) in currently produced devices, with significantly reduced dimensions for device generations that are currently under development. Consequently, the actual feature dimensions may be well below the wavelength of currently used light sources provided in current lithography systems. For example, presently, in critical lithography steps, an exposure wavelength of 193 nm may be used, which, therefore, may require complex techniques for finally obtaining resist features having dimensions well below the exposure wavelength. Thus, highly non-linear processes are typically used to obtain dimensions below the optical resolution. For example, extremely non-linear photoresist materials may be used, in which a desired photochemical reaction may be initiated on the basis of a well-defined threshold so that weakly exposed areas may substantially not change at all, while areas having exceeded the threshold may exhibit a significant variation of their chemical stability with respect to a subsequent development process.

Consequently, significant advances and development of appropriate photoresist materials in combination with the progresses made in providing highly complex imaging tools may enable the printing of mask features having critical dimensions that are significantly less compared to the exposure wavelength used. Moreover, additional process techniques may be applied, which enable a further reduction of the resist features, thereby even further reducing the critical dimensions of circuit elements. For example, appropriate hard mask features may be formed on the basis of sophisticated trim etch techniques having a width of approximately 50 nm, thereby enabling the patterning of gate electrode structures having a gate length that substantially corresponds to the width of the mask features. Upon further reducing the overall dimensions of sophisticated semiconductor devices, not only the length of the gate electrode structure has to be reduced, for instance to 50 nm and less, but also the width of the gate electrode structures have to be reduced to several hundred nanometers and significantly less, in particular in densely packed device areas, such as static RAM areas in complex semiconductor devices. In addition, the tip-to-tip critical dimension from one gate to another has to be reduced in order to guarantee sufficient gate past active coverage such that the active area for maximum transistor drive currents can be enlarged.

Since critical lithography processes may be controlled more efficiently by printing resist features which have a critical dimension in one lateral direction only, it has been proposed to split the patterning process for providing appropriate resist features for sophisticated gate electrode structures into two steps in order to appropriately adjust the gate length, for instance on the basis of trim etch techniques, and the gate width, thereby allowing reduced transistor width, as is frequently required in critical device areas, such as RAM areas. It turns out, however, that upon further shrinkage of the overall device dimensions, the two-step patterning process for forming the mask features for the gate electrode structures may suffer from reduced scalability and controllability, as will be described in more detail with reference to FIGS. 1a-1j.

Figure 1A:
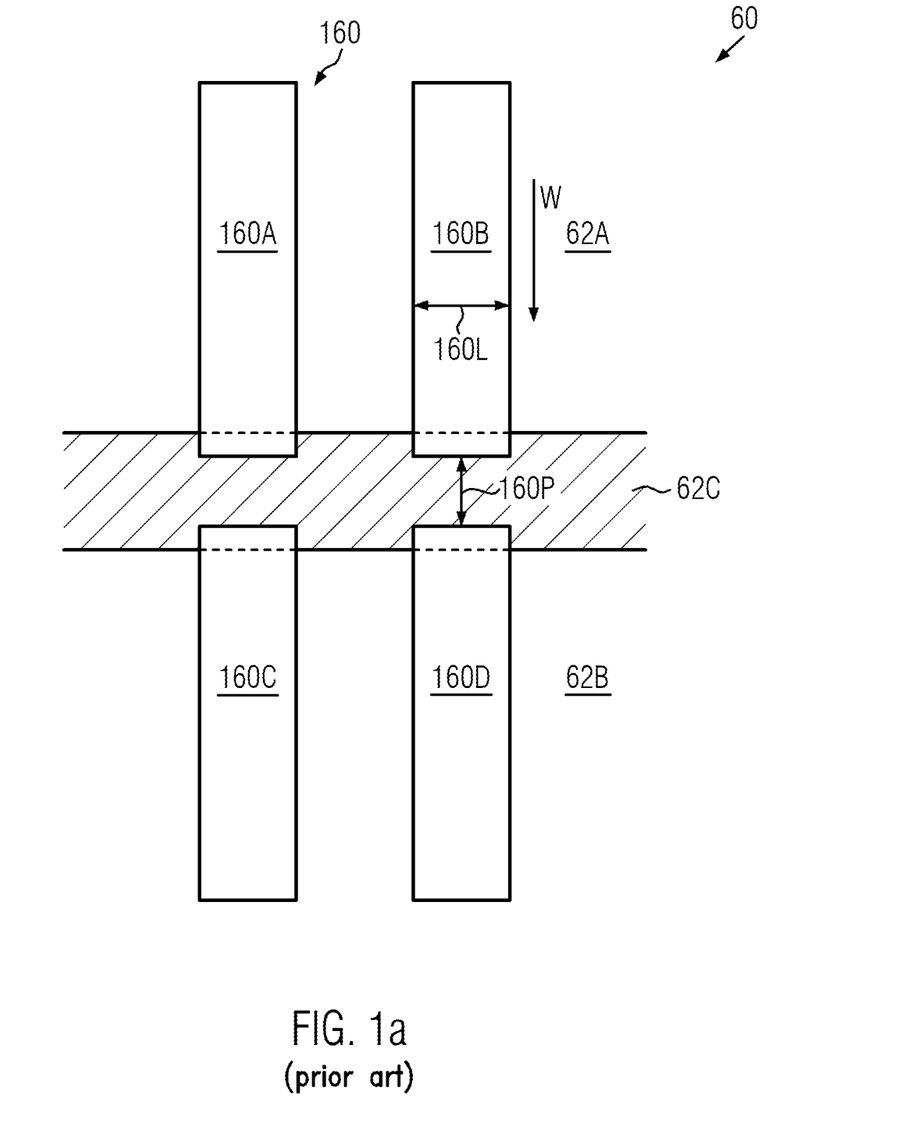
FIG. 1a schematically illustrates a top view of a semiconductor device comprising a plurality of closely spaced gate electrode structures.

FIG. 1a schematically illustrates a top view of a typical layout or an actual implementation of a semiconductor device 60, which may have to be formed on the basis of reduced transistor dimensions. As illustrated, the semiconductor device 60 may comprise active regions 62A, 62B, which are to be understood as semiconductor regions in and above which one or more transistors are to be formed. Typically, the active regions 62A, 62B are laterally delineated by an isolation structure or region 62C, such as a silicon dioxide region, and the like. Furthermore, a plurality of gate electrode structures 160 are provided above the active regions 62A, 62B in accordance with the general layout of the semiconductor device 60, as is, for instance, required in a densely packed device region. For example, the gate electrode structures 160 may comprise gate electrode structures 160A, 160B, 160C, 160D, which may have a gate length 160L that is typically 50 nm and less in sophisticated semiconductor devices. In densely packed device areas, the gate electrode structures 160, such as the gate electrode structures 160A, 160B, have to be provided with a minimum lateral off-set or pitch, which may by 60 nm and less, depending on the overall device requirements. As discussed above, typically, the width of corresponding transistors and thus the width, indicated by W, of the gate electrode structures 160 has to be reduced, thereby also requiring a lateral distance or off-set in the width direction, as indicated by 160P, which may be in the same order of magnitude as the gate length in sophisticated applications. For example, the lateral distance 160P may be selected so as to allow a certain overlap with the isolation region 62C while at the same time reliably isolating the various gate electrode structures from each other. Consequently, upon further reducing the overall dimensions, for example the width of the isolation structure 62C, the lateral distance 160P may also represent a very critical dimension in forming the gate electrode structures 160. Consequently, strategies have been proposed in which the gate length 160L may be defined by performing the first patterning process, followed by a further patterning process, in which the lateral distance 160P may be defined.

Figure 1B:
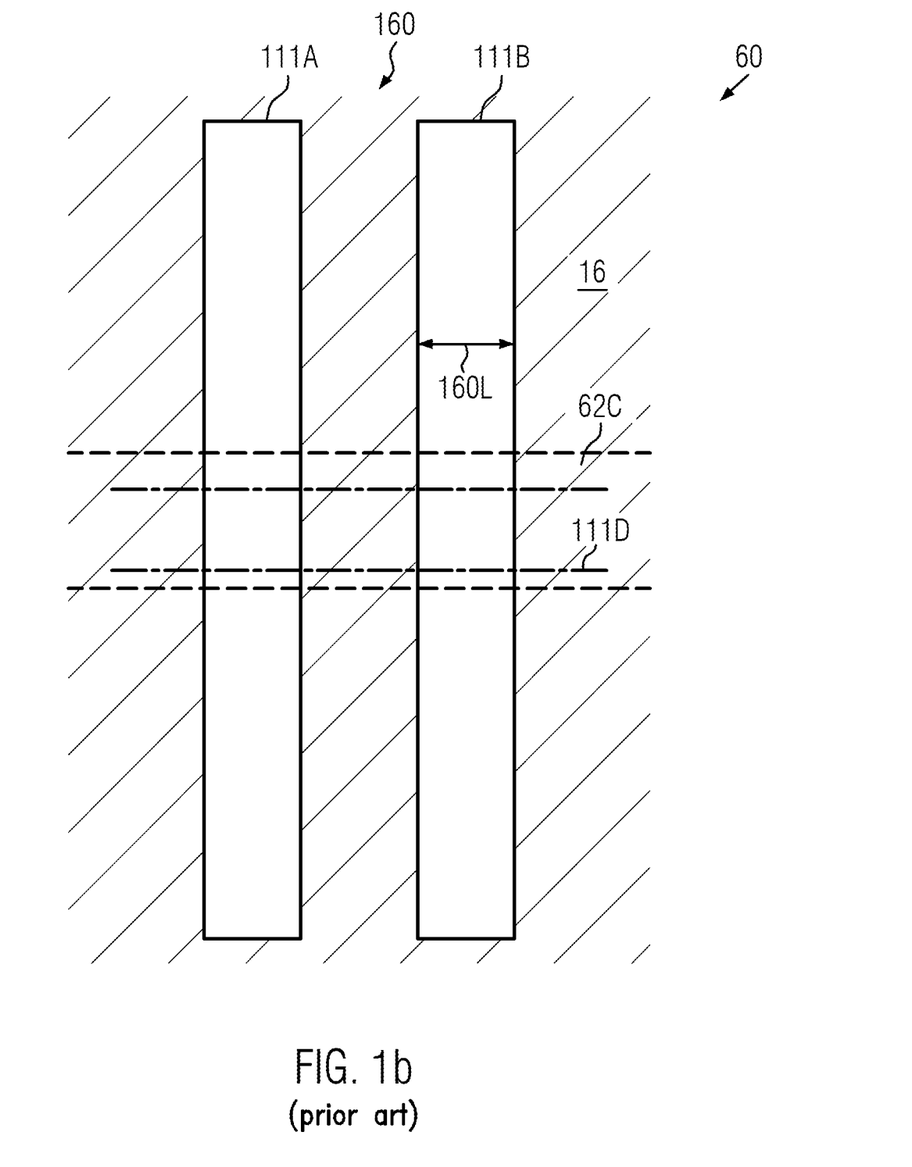
FIG. 1b schematically illustrates a top view illustrating a strategy for forming the plurality of gate electrode structures on the basis of a double exposure double etch patterning regime, according to conventional strategies.

FIG. 1b schematically illustrates a top view of the device 60 when performing a two-step patterning process for forming the gate electrode structures 160 as shown in FIG. 1a. As illustrated, in this manufacturing stage, mask features 111A, 111B may be formed above the mask layer 16, which may represent any appropriate hard mask material, such as silicon dioxide, silicon nitride and the like, which may result in a significantly reduced etch rate compared to an actual gate electrode material, such as polysilicon and the like. The mask features 111A, 111B may be provided in the form of resist features, which may be obtained on the basis of sophisticated lithography techniques, in combination with any additional etch trim processes and the like, in order to determine the lateral size and position of the gate electrode structures 160, however, without determining the width thereof. This may be accomplished by a further lithography and patterning process, in which a mask opening may be formed in the mask layer 16, thereby "cutting" the gate electrode structures 160 defined by the size and position of the resist features 111A, 111B into gate electrode portions of a desired width, as is shown in FIG. 1a. A corresponding process for forming the mask features 111A, 111B and the mask opening and a subsequent patterning process for forming the actual gate electrode structures 160A . . . 160D (FIG. 1a) will now be described in more detail with reference to FIGS. 1c-1j.

Figures 1C, 1D:
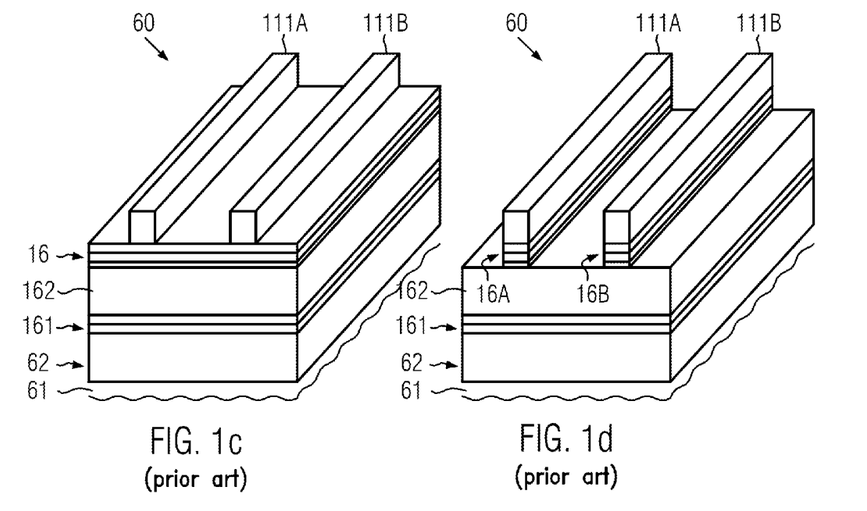
FIGS. 1c-1j schematically illustrate perspective views of the semiconductor device during various manufacturing stages in forming gate electrode structures by first providing mask features defining the gate length and subsequently forming an opening that defines the gate width, according to conventional strategies.

FIG. 1c schematically illustrates a perspective view of the semiconductor device 60 comprising a substrate 61, such as a silicon material, an SOI (silicon-on-insulator) substrate and the like. Furthermore, a semiconductor layer 62, such as a silicon layer, may be provided above the substrate 61 and may comprise a plurality of active regions and isolation structures, as is also described above with reference to FIG. 1a. Furthermore, a gate dielectric material 161, for instance in the form of silicon dioxide, silicon oxynitride and the like, is formed above the semiconductor layer 62, followed by an electrode material 162, such as a polysilicon material and the like. The mask layer 16, which may comprise a plurality of sub-layers, depending on process specifics and the like, is formed above the electrode material 162. Moreover, in the manufacturing stage shown, the mask features 111A, 111B are formed on the mask layer 16. For example, the mask features 111A, 111B may be comprised of a resist material.

The semiconductor device 60 as illustrated in FIG. 1c may be formed on the basis of the following process strategies. The semiconductor lay 62 may be patterned to receive appropriate isolation structures, such as the isolation region 62C of FIG. 1a, which may be accomplished by sophisticated lithography, etch, deposition and planarization techniques. In this manner, also any active regions in the semiconductor layer 62 may be laterally delineated and may be subsequently treated to adjust the desired basic transistor characteristics by incorporating an appropriate well dopant species and the like. Next, the gate dielectric material 161 may be formed, for instance by oxidation, deposition and the like, followed by the deposition of the electrode material 162, using well-established low pressure chemical vapor deposition (CVD) techniques and the like. Thereafter, the hard mask layer 16, which may comprise two or three sub-layers and the like, may be deposited on the basis of appropriate deposition techniques. For example, silicon dioxide, silicon nitride, amorphous carbon and the like may be efficiently used as hard mask materials. Next, an appropriate material system including a resist material may be formed and exposed by using sophisticated lithography techniques. The resist material may then be developed and further treated so as to adjust the desired gate length, as discussed above with reference to FIGS. 1a and 1b. To this end, well-established trim etch techniques may be applied. Consequently, the further processing may be continued on the basis of the resist features 111A, 111B, having the target gate length, while on the other hand, the width is still to be defined on the basis of a further lithography process.

FIG. 1d schematically illustrates the device 60 after an etch process for patterning the mask layer 16 on the basis of the resist features 111A, 111B. Consequently, corresponding mask features in the form of hard mask features 16A, 16B may be provided and may thus have a desired gate length. To this end, any well-established anisotropic etch techniques, such as reactive ion etching and the like, may be used.

Figures 1E, 1F:
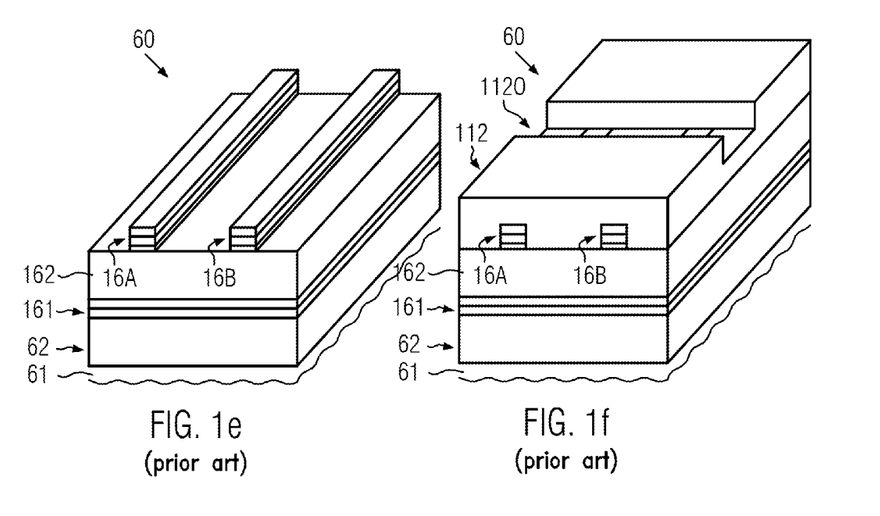

FIG. 1e schematically illustrates the semiconductor device 60 after the removal of the mask features 111A, 111B (FIG. 1d). In this stage, the device 60 may be prepared for a further critical lithography process in order to "cut" the hard mask features 16A, 16B so as to have the desired target width.

FIG. 1f schematically illustrates the device 60 with a corresponding opening or trench 1120 formed in a material system 112, which may comprise a resist material, an anti-reflective coating (ARC) material in combination with a planarization material, as discussed above. Due to the aggressive scaling of transistor devices, the width of the trench, which may thus define the lateral distance 160P (FIG. 1a) may represent a critical dimension and may have to be provided at the limit of the solution capabilities of sophisticated lithography processes. Consequently, upon further device scaling, the width of the opening 1120 may not allow further reduction of the lateral distance 160P (FIG. 1a), unless significant efforts may be made, for instance for developing new resist materials, further improving the optical characteristics of the complex lithography systems, or implement specific etch techniques upon forming the opening and/or upon etching through the mask features 16A, 16B.

Figures 1G, 1H:
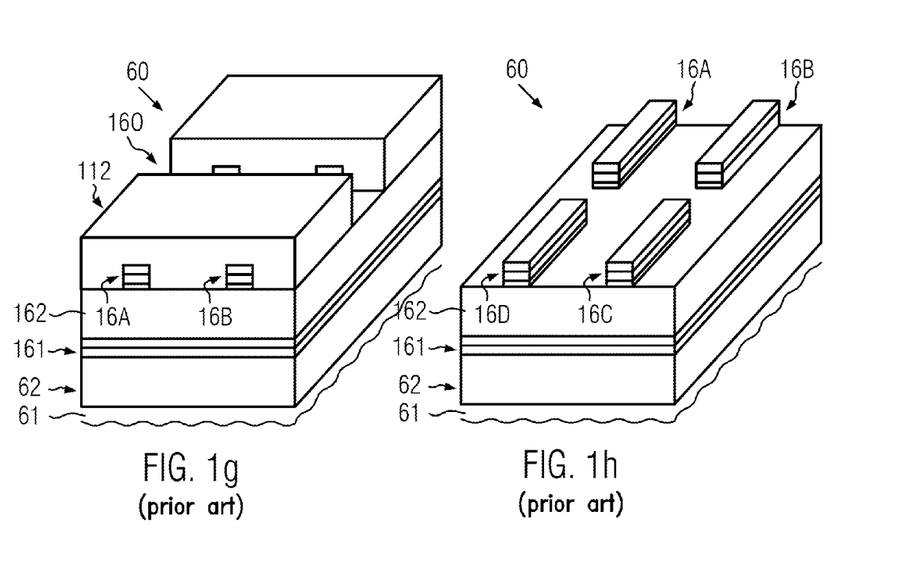

FIG. 1g schematically illustrates the semiconductor device 60 after forming a mask opening 160 on the basis of the opening 1120 (FIG. 1f) by etching through the exposed portions of the mask features 16A, 16B. In some conventional approaches, the above-indicated limitations upon forming the opening 1120 (FIG. 1f) may be overcome by applying sophisticated etch techniques in order to actually reduce the lateral size of the opening 1120, thereby also reducing the lateral distance 160P of FIG. 1a. For example, complex polymerization components may be added to the plasma-based etch chemistry in order to create a certain "deposition" behavior during the etch process at sidewalls of the openings 1120, thereby also reducing the lateral distance between isolated portions of the mask features 16A, 16B.

FIG. 1h schematically illustrates the device 60 after the removal of the material system 112 (FIG. 1g). Thus, as illustrated, a plurality of isolated mask features 16A, 16B, 16C and 16D are provided, which may have a desired gate length, for instance as defined by the resist features 111A, 111B of FIG. 1c, while the lateral distance 160P (FIG. 1a) may be obtained as defined by the opening 112O of FIG. 1f.

Figures 1I, 1J:
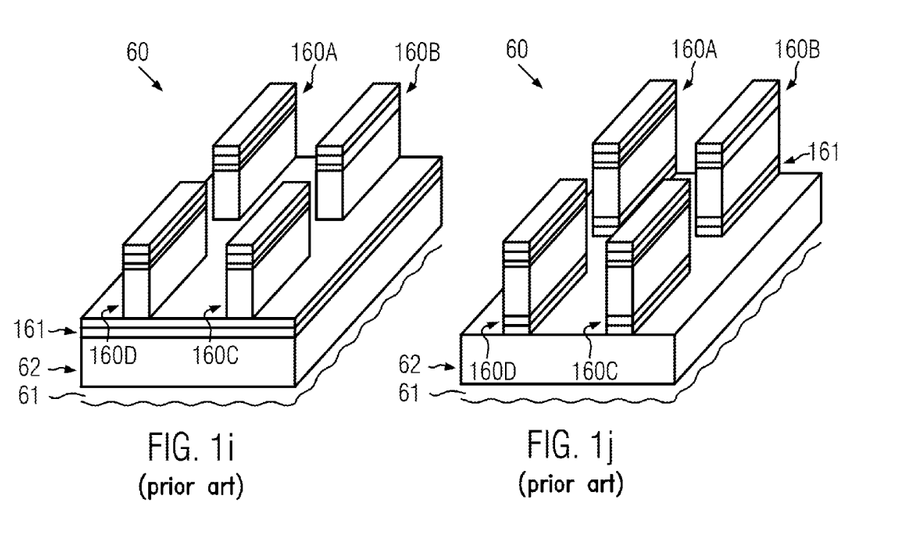

FIG. 1i schematically illustrates the semiconductor device 60 in a further advanced manufacturing stage, in which the plurality of gate electrode structures 160A, 160B, 160C and 160D are formed on the basis of any appropriate anisotropic etch technique, in which the mask features 16A, 16B, 16C and 16D are used as an efficient etch mask.

FIG. 1j schematically illustrates the semiconductor device 60 in a further advanced manufacturing stage, in which the gate dielectric material 161 is also patterned, which may be accomplished in a separate etch process on the basis of any well-established etch techniques.

Consequently, the arrangement of the isolated gate electrode structures 160A, 160B, 160C and 160D may be obtained on the basis of two different patterning sequences, each including a specific lithography process and an etch process in order to provide the hard mask features 16A, 16B, 16C and 16D, wherein the gate length may be determined on the basis of etch trim techniques, while, however, the lateral distance 160L (FIG. 1a) may be increasingly difficult to be implemented upon further device scaling. On the other hand, sophisticated etch techniques, for instance using polymerizing gases during the etch process for transferring the opening 112O (FIG. 1f) into the underlying mask features may result in significant device variations, while other approaches, such as improving the resist materials and/or the optical imaging system, may require significant research and development improvements and any such improvements are not yet available.

In US Patent Publication No. 2012/0049286, a different approach was suggested. According to the teachings of US 2012/0049286, the lateral dimensions of a mask opening are reduced by forming a spacer element on inner sidewalls thereof in order to determine the lateral dimensions of circuit features in one direction. Thereafter, appropriate mask features are formed above the underlying mask layer including the mask opening of reduced lateral dimensions. The mask opening defines a lateral separation of the mask features. On the other hand, the widths of the mask features that correspond to a desired gate length are adjusted by using any appropriate process technique, such as trim etch techniques. Consequently, upon transferring the mask features into the underlying mask layer, the desired lateral dimensions in both lateral directions may be obtained in the mask layer with a higher degree of controllability and superior uniformity compared to conventional strategies as described above. However, it turned out that the mask opening involved in the taught procedure may undesirably leave some imprint in the polysilicon layer of the gate electrode of a transistor. This imprint deteriorates the overall operation of the finished transistor/semiconductor device.

In view of the situation described above, the present disclosure relates to manufacturing techniques for semiconductor devices, in which circuit features, such as gate electrode structures with minimized tip-to-tip critical dimensions (distances) from one tip of a gate electrode to another tip of another gate electrode, may be formed, while alleviating one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques for semiconductor devices and semiconductor devices in which circuit features, such as gate electrode structures, may be provided on the basis of an appropriate lithography and patterning regime, in which the respective critical dimensions may be defined with superior controllability and scalability. Circuit features with gate electrode structures may be formed with a desired gate length and also with a reduced lateral distance in the width direction, wherein well-controllable process techniques may be applied, thereby contributing to superior device uniformity and reduced overall process complexity compared to conventional approaches.

Particularly, spacer elements are formed at sidewalls of mask features after a hard mask opening process. After the formation of the spacer elements, the final gate etching is performed. One illustrative method of forming a semiconductor device comprises the steps of forming a dielectric material layer on a semiconductor layer, forming a gate electrode material layer on the dielectric material layer, forming mask features on the gate electrode material layer, forming a spacer layer on the mask features and at sidewalls of the mask features and on the gate electrode material layer between the mask features (i.e., on portions of the gate electrode material that are exposed by the mask features), removing the spacer layer from the gate electrode material layer between the mask features, and etching the gate electrode material layer and dielectric material layer using the hard mask features as an etch mask in order to obtain gate electrode structures. The lateral distances (in the width direction) are particularly determined by the portion of the spacer layer (spacer elements) formed on the sidewalls of the mask features. By the expression "formed on," it can be meant that the respective layer is formed directly (without any other intermediate material) on another layer, whereas by "formed over," it can be meant that the respective layer is formed over another layer with some additional intermediate material present between the layers.

In addition, a semiconductor device is provided that includes a first gate electrode structure covered by a first cap layer and a second gate electrode structure covered by a second cap layer, wherein each of the first and second cap layers comprises a mask material surrounded at the sidewalls thereof by a spacer material different from the mask material and wherein the distance between the first and second electrode structures in the direction of the widths of the same is at most 60 nm, particularly, at most 50 nm.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure provides manufacturing techniques for semiconductor devices, in which critical circuit elements, such as line-like features, for instance in the form of gate electrode structures, may be formed on the basis of a double exposure double etching sequence, wherein a mask opening may be formed in a hard mask material in order to appropriately define the lateral distance of the circuit features in one lateral direction, such as the width direction of gate electrode structures, which may be accomplished by using deposition and etching techniques for defining the desired critical dimension in this lateral direction. Particularly, gate electrode structures may be provided with a reduced lateral distance along the gate width direction while nevertheless providing superior device uniformity and integrity, as well as process controllability, without unduly increasing overall complexity compared to conventional strategies.

Figures 2A, 2B:
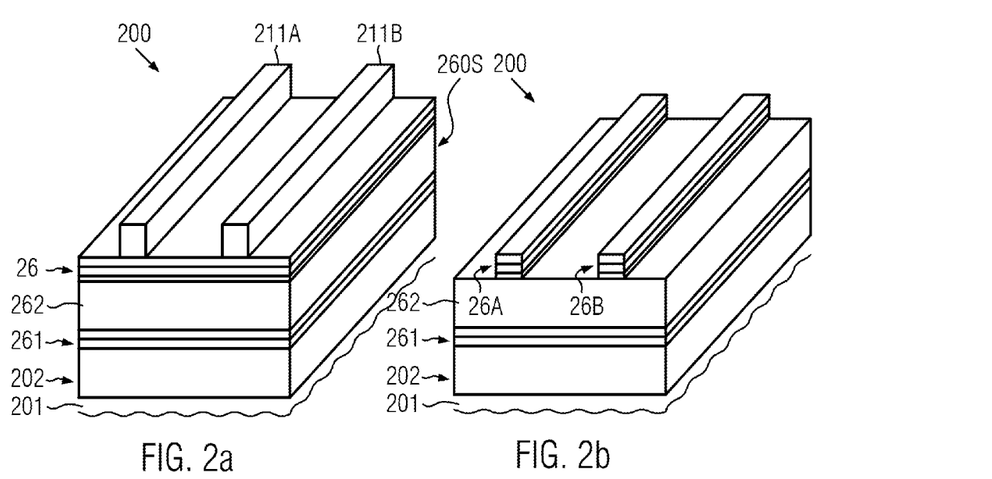
FIGS. 2a-2d illustrate perspective views of a semiconductor device during various manufacturing stages in forming gate electrode structures based on hard mask features.

FIGS. 2a and 2b illustrate a first lithography process to define a gate length. FIG. 2a schematically illustrates a perspective view of a semiconductor device 200 in a process stage in which a gate electrode structure is to be formed from a gate layer stack 260S. In this manufacturing stage, the semiconductor device 200 may comprise a substrate 201 in combination with a semiconductor layer 202. The semiconductor substrate 201 may comprise a semiconductor layer, which in turn may be comprised of any appropriate semiconductor material, such as silicon, silicon/germanium, silicon/carbon, other II-VI or III-V semiconductor compounds and the like. The semiconductor layer 202 may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon and the like. Furthermore, the substrate and the semiconductor layer may define an SOI configuration. The semiconductor substrate can be a silicon substrate, in particular, a single crystal silicon substrate. Other materials can be used to form the semiconductor substrate as, for example, germanium, silicon/germanium, gallium phosphate, gallium arsenide, etc.

The semiconductor layer 202 may be formed on a crystalline material of the substrate 201 in a bulk configuration. Furthermore, the semiconductor layer 202 may comprise a plurality of active regions, which may be laterally delineated by an isolation structure. The layer stack 260S, which may represent a gate layer stack in some illustrative embodiments, may comprise a dielectric material 261, followed by an electrode material 262. The electrode material 262 may be provided in the form of a polysilicon material, an amorphous silicon material, a silicon/germanium material, and a metal containing cap material may also be provided. For example, titanium and nitrogen containing materials are frequently used as a base material for providing a conductive cap layer. Similarly, the cap layer, if provided, may be formed by any appropriate deposition technique, wherein, in some cases, additional patterning regimes may be applied so as to provide an appropriate work function species in and above the dielectric layer 261 depending on the type of transistor to be formed in and above the active regions.

Moreover, the dielectric layer 261, which may represent a gate dielectric material in the embodiment shown, or which may at least represent an appropriate etch stop material, may be provided in the form of one or more dielectric materials. For example, in sophisticated applications, gate electrode structures may be formed on the basis of a high-k dielectric material in order to reduce unwanted gate leakage currents, while at the same time providing a high controllability of the corresponding transistor elements. A high-k dielectric material may generally be understood as any dielectric material, i.e., any insulating material having a dielectric constant of 10.0 and higher. For example, a plurality of metal oxides may provide the required insulating characteristics and may have a moderately high dielectric constant, such as hafnium oxide, hafnium silicon oxide, zirconium oxide, aluminum oxide and the like. For example, a high-k dielectric material layer may be provided in the dielectric layer 261, possibly in combination with a "conventional" dielectric material, such as a silicon dioxide base material and the like. In sophisticated applications, the conventional dielectric layer, if provided, may have a thickness of 1 nm or less, while the high-k dielectric material layer may have a thickness of one to several nanometers. The dielectric layer 261 may be formed by oxidation and/or deposition, depending on the materials required in the layer 261.

Furthermore, a mask layer 26 may be formed above the layer stack 260S. For example, the mask layer 26 may comprise a silicon nitride material, a silicon dioxide material and the like. For example, forming the mask layer 26 may comprise forming a first oxide layer on the electrode material, a nitride layer on the first oxide layer and a second oxide layer on the nitride layer. The first oxide layer may be formed as a silicon (di)oxide layer and the second oxide layer may be formed as a nitride oxide layer. The mask layer 26 provided above the layer stack 260S may be provided together with additional materials, such as etch stop layers and the like. For example, the mask layer 26 may substantially be comprised of silicon nitride, silicon dioxide and the like, while the etch stop or etch control layers, if provided, may have a different material composition in order to enable an efficient stopping of an etch process and/or to release a well detectable species during a corresponding etch process, thereby providing a reliable etch stop signal, which may then be used for controlling any etch processes to pattern the mask layer 26.

Mask features 211A, 211B may be provided in the form of resist features, which may be obtained on the basis of sophisticated lithography techniques, in combination with any additional etch trim processes and the like, in order to determine the lateral size and position of the gate electrode structures that are to be built without determining the width thereof.

A hard mask opening etch is performed that opens the hard mask in portions where it is not covered by the resist features. After stripping of the resist, the configuration results in that shown in FIG. 2b. Resist removal may be accomplished by applying plasma-assisted and/or wet chemical etch processes. In this stage, the device 200 may be prepared for a further critical lithography process in order to "cut" the hard mask features 211A, 211B so as to have the desired target width. To this end, appropriate material assistance, such as optical planarization materials, may be applied so as to provide a substantially planar surface topography, followed by the deposition of a resist material, possibly in combination with an additional ARC material and the like. Next, a lithography process may be performed on the basis of a lithography mask, which may define the lateral size and position of a trench to be formed in the resist material, which in turn may define the lateral distance between gate electrodes.

Figures 2C, 2D:
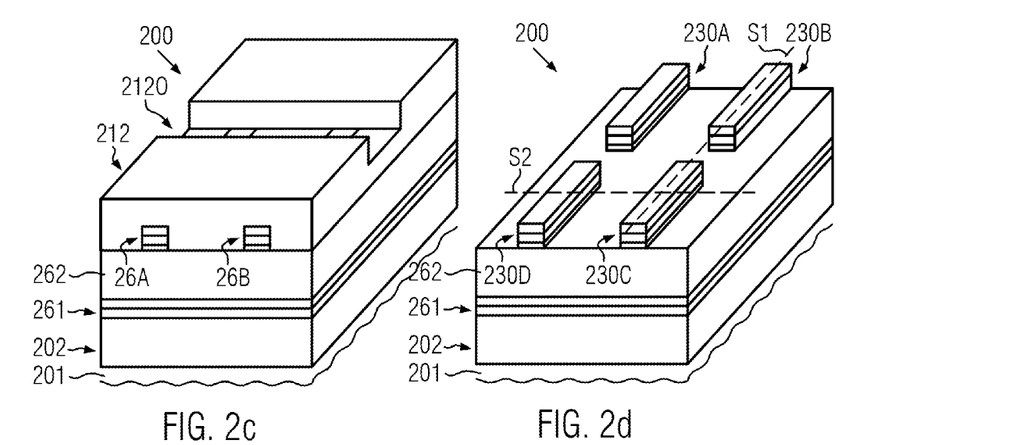

FIGS. 2c and 2d illustrate a second lithography process to define a preliminary lateral distance (in the width direction) between neighboring gate electrodes. FIG. 2c schematically illustrates the device 200 with a corresponding opening or trench 212O formed in a material system 212, which may comprise a resist material, an ARC material in combination with a planarization material, as discussed above in the context of FIG. 1f. Due to the aggressive scaling of transistor devices, the width of the trench 212O, which may thus define the lateral distance, may represent a critical dimension and may have to be provided at the limit of the solution capabilities of sophisticated lithography processes.

Based on the opened material system 212, etching through the exposed portions of the hard mask features 211A, 211B may be performed. Patterned hard mask features 230A, 230B, 230C and 230D result, as shown in FIG. 2d. The structure that results after removal of the remaining material system 212 is shown in FIG. 2d and is similar to the intermediate product resulting from the manufacturing procedure known in the art (compare FIG. 1h). However, starting from this stage, the inventive method according to the shown example differs significantly from the known techniques.

Figure 2E:
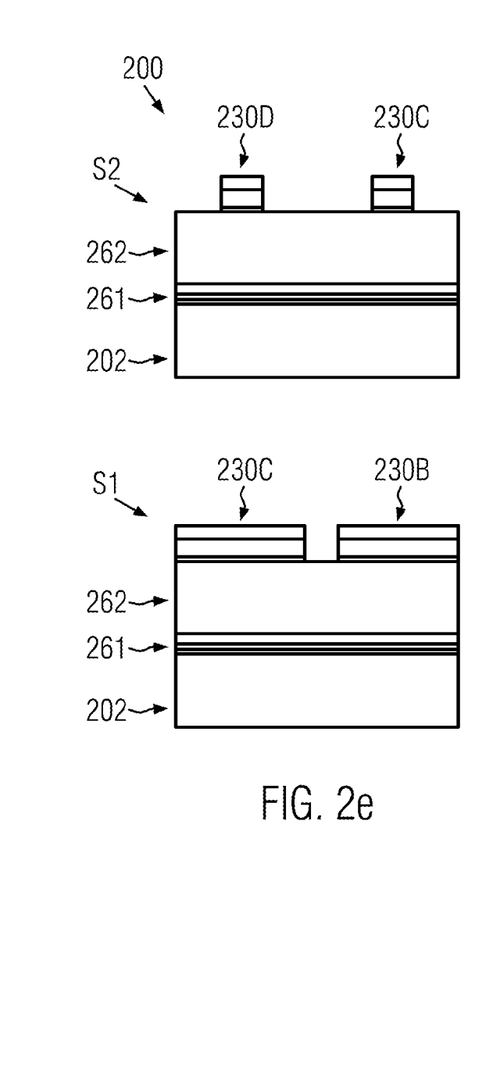
FIGS. 2e-2g schematically illustrate perspective views of the semiconductor device during various manufacturing stages in forming gate electrode structures with spacer elements formed at sidewalls of mask features covering gate electrodes according to an example of the inventive manufacturing process.
Figure 2F:
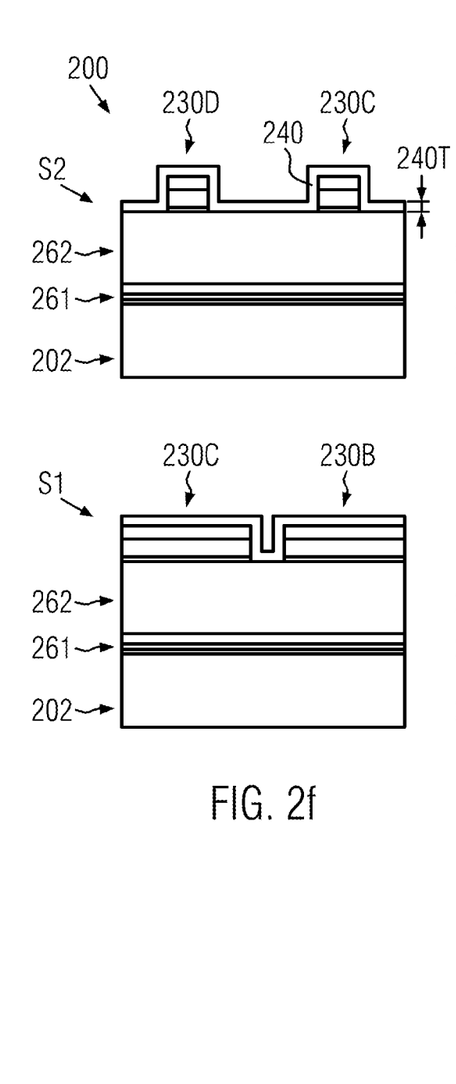
Figure 2G:
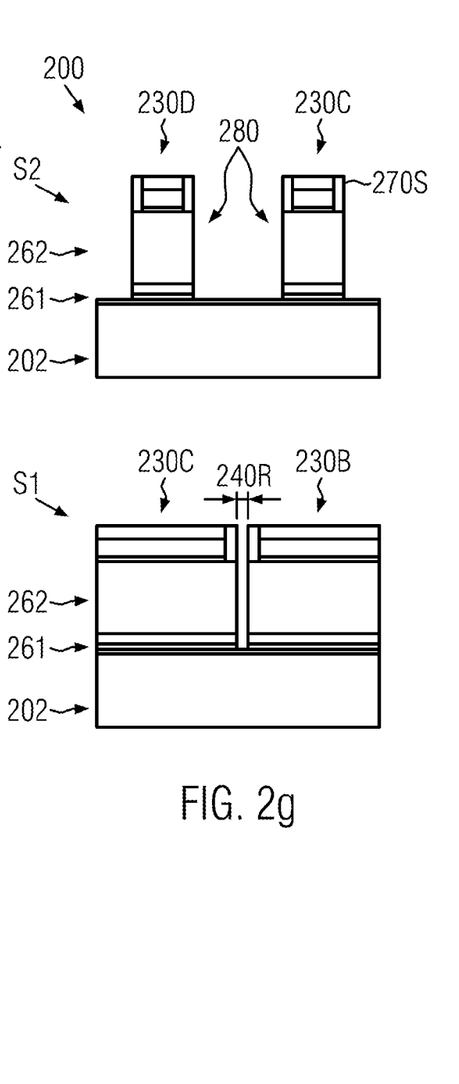

FIGS. 2e, 2f and 2g show further developed manufacturing stages wherein the respective top sketches show cross-sections of the semiconductor device along line s2 indicated in FIG. 2d, whereas the respective bottom sketches show cross-sections of the semiconductor device along line s1 indicated in FIG. 2d. FIG. 2e shows the cross-sections for the same manufacturing state as illustrated in FIG. 2d.

As shown in FIG. 2f, a spacer layer 240 is formed over the entire structure shown in FIGS. 2d and 2e. The spacer layer 240 may be formed with a desired thickness 240T by using well-controllable and well-established deposition techniques, in principle, such as thermally activated CVD techniques, plasma enhanced CVD techniques and the like. For example, the spacer layer 240 may comprise or consist of SiN. The thickness of the spacer layer 240 at the sidewalls of the mask features 230A, 230B, 230C and 230D may be controlled to lie in the range of some nm to 10 nm or 20 nm. The spacer layer 240 may be formed by atomic layer deposition, in particular, plasma enhanced atomic layer deposition. Plasma enhanced atomic layer deposition allows for excellent thickness control of the spacer layer 240 and provides for a highly conformal deposition. Plasma enhanced atomic layer deposition uses chemical precursors just like in thermal atomic layer deposition but it also cycles an RF-plasma creating the necessary chemical reactions in a highly controlled manner. By the introduction of a low-temperature plasma step in the atomic layer deposition reaction cycle, it is possible to deliver additional reactivity to the surface in the form of plasma-produced species. This opens up a processing parameter space that is unattainable by merely thermally-driven processes. Consequently, the spacer layer 240 may also be formed in a highly conformal manner reducing the distances between the hard mask features 230A, 230B, 230C and 230D as isolated components comprising sidewall spacers in the form of the spacer layer 240. The lateral distances between the hard mask features 230A and 230D and 230B and 230C, respectively, along S2 (the direction of the widths of the eventually formed gate electrode structures) are thus determined by the thickness of the spacer layer 240 (spacer elements) at the sidewalls of the hard mask features 230A, 230B, 230C and 230D.

On the basis of the mask features 230A, 230B, 230C and 230D covered with the spacer layer 240, the underlying layer stack 260S may be patterned in order to form circuit elements, such as gate electrode structures. That is, during the corresponding anisotropic patterning process, the lateral dimensions of the mask features 230A, 230B, 230C and 230D may be transferred into the layer stack 260S. First, the spacer layer 240 is etched to open the polysilicon layer 262 between the mask features 230A, 230B, 230C and 230D. Next, the polysilicon layer 262 is etched between the mask features 230A, 230B, 230C and 230D after change of etch chemistry if considered appropriate. This patterning process may be stopped on the dielectric material 261, which may subsequently be patterned in a further dedicated etch step after change of etch chemistry if considered appropriate.

FIG. 2g schematically illustrates the device 200 after the patterning of the dielectric layer 261, wherein the gate electrode structures 280 are formed that are covered by the mask features 230A, 230B, 230C and 230D and with the material of the spacer layer 240 at least at the sidewalls of the mask features 230A, 230B, 230C and 230D defining spacer elements 270S. The lateral distances 240R between the hard mask features 230A, 230B, 230C and 230D translate to the lateral distances between the gate electrode structures 280. Thus, the lateral distance 240R, i.e., a distance along a width direction of the gate electrode structures 280, is determined by the spacer elements 270S and the initial width as defined by the mask features 230A, 230B, 230C and 230D. Particularly, the lateral distance 240R is smaller than the preliminary lateral distance resulting from the above-described second lithography process. A typical lateral distance 204R may be below 50 nm, in particular, below 30 or 20 nm. Consequently, the tip-to-tip critical dimensions of neighboring gate electrodes 280 are significantly reduced as compared to the conventional techniques described with reference to FIGS. 1a-1j without affecting the polysilicon material 262 of the gate electrodes 280 during some opening mask etching process. The gate electrode structures 280 may be formed above active regions and may also extend above a certain portion of an isolation structure formed between them.

Based on the configuration as shown in FIG. 2g, the further processing may be continued in accordance with any appropriate process strategy. For example, the sidewalls of the gate electrode structures 280 may be covered by an appropriate liner material, if considered appropriate. Thereafter, in sophisticated applications, strain-inducing mechanisms may be implemented, for instance, by incorporating a strain-inducing material into active regions of at least one type of transistor, which may be accomplished by forming corresponding cavities and refilling the cavities with an appropriate semiconductor material, such as a silicon/germanium material and the like. In some illustrative embodiments, the electrical performance of the gate electrode structures 280 may further be improved by at least partly replacing the electrode material 262 with a highly conductive electrode metal, such as aluminum and the like. Moreover, it may be desired to provide the spacer layer (spacer elements) in the form of a strained material providing compressive or tensile stresses. In other cases, in addition to replacing the material 262, a high-k dielectric material may be provided after removing the electrode material 262. In other cases, the dielectric material 261 may already comprise a high-k dielectric material and also an appropriate work function may have been adjusted in an early manufacturing stage, i.e., upon forming the initial layer stack 260S (FIG. 2a). In other illustrative embodiments, the gate electrode structures 260A, 210D may be provided in the form of "conventional" electrode structures comprising a silicon dioxide based dielectric material in combination with a polysilicon material.

As a result, the present disclosure provides manufacturing techniques for semiconductor devices comprising transistor devices wherein the lateral tip-to-tip critical dimensions from one gate electrode to another gate electrode along the width direction are significantly reduced as compared to the art by means of the formation of a spacer layer particularly formed at sidewalls of mask features before a gate etching process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor device, comprising:
    forming a dielectric material layer on a semiconductor layer;
    forming a gate electrode material layer on said dielectric material layer;
    forming mask features on said gate electrode material layer, wherein forming said mask features includes performing a first lithography process so as to define a gate length and performing a second lithography process so as to define a preliminary lateral distance between said gate electrode structures, said first lithography process including:
        forming a mask layer on said gate electrode material layer;
        forming a first resist layer on said mask layer and patterning said first resist layer;
        forming a patterned mask layer based on said patterned first resist layer;
        forming a second resist layer on said patterned mask layer and patterning said second resist layer; and
        etching said patterned mask layer based on said patterned second resist layer to obtain said mask features;
    forming a spacer layer on said mask features and at sidewalls of said mask features and on said gate electrode material layer between said mask features;
    removing a portion of said spacer layer from said gate electrode material layer between said mask features to define spacers on said gate electrode material between said mask features, and
    etching said gate electrode material layer and said dielectric material layer using said mask features and said spacers as an etch mask to obtain gate electrode structures.

2. The method of claim 1, wherein forming said spacer layer is performed by atomic layer deposition.

3. The method of claim 1, wherein said spacer layer comprises nitride.

4. The method of claim 1, wherein said spacer layer is a strained layer.

5. The method of claim 1, wherein said mask features comprise at least one of silicon dioxide and silicon nitride.

6. The method of claim 1, wherein said dielectric layer comprises a high-k dielectric material.

7. The method of claim 1, wherein forming said gate electrode material layer comprises forming a polysilicon layer and forming a metal layer above said polysilicon layer.

8. The method of claim 1, further comprising forming a strained layer on at least one of said gate electrode structures.

9. A method of forming a semiconductor device, comprising:
    forming a dielectric material layer on a semiconductor layer;
    forming a gate electrode material layer on said dielectric material layer;
    forming mask features on said gate electrode material layer by:
        forming a mask layer on said gate electrode material layer by forming a first oxide layer on said gate electrode material layer, a nitride layer on said first oxide layer and a second oxide layer on said nitride layer;
        forming a first resist layer on said second oxide layer and patterning said first resist layer;

forming a patterned mask layer based on said patterned first resist layer;
forming a second resist layer on said patterned mask layer and patterning said second resist layer; and
etching said patterned mask layer based on said patterned second resist layer to obtain said mask features;
forming a spacer layer on said mask features and at sidewalls of said mask features and on said gate electrode material layer between said mask features;
removing a portion of said spacer layer from said gate electrode material layer between said mask features to define spacers on said gate electrode material between said mask features, and
etching said gate electrode material layer and said dielectric material layer using said mask features and said spacers as an etch mask to obtain gate electrode structures.

10. The method of claim 9, wherein forming said spacer layer is performed by atomic layer deposition.

11. The method of claim 9, wherein said spacer layer comprises nitride.

12. The method of claim 9, wherein said spacer layer is a strained layer.

13. The method of claim 9, wherein said mask features comprise at least one of silicon dioxide and silicon nitride.

14. The method of claim 9, wherein said dielectric layer comprises a high-k dielectric material.

15. The method of claim 9, wherein forming said gate electrode material layer comprises forming a polysilicon layer and forming a metal layer above said polysilicon layer.

16. The method of claim 9, further comprising forming a strained layer on at least one of said gate electrode structures.

* * * * *